(12) United States Patent
Edwards et al.

(10) Patent No.: US 8,704,271 B2
(45) Date of Patent: Apr. 22, 2014

(54) BIDIRECTIONAL ELECTROSTATIC DISCHARGE (ESD) PROTECTION

(75) Inventors: Henry Litzmann Edwards, Garland, TX (US); Akram A. Salman, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 34 days.

(21) Appl. No.: 13/457,600

(22) Filed: Apr. 27, 2012

(65) Prior Publication Data

US 2013/0285113 A1 Oct. 31, 2013

(51) Int. Cl.
*H01L 29/66* (2006.01)
(52) U.S. Cl.
USPC .................. 257/124; 257/133; 257/E27.004
(58) Field of Classification Search
USPC .......... 257/124, 133, 355, 409, 506, E27.004, 257/E29.256, E29.261, E25.012, E25.016
See application file for complete search history.

(56) References Cited

U.S. PATENT DOCUMENTS

| | | | |
|---|---|---|---|
| 6,288,424 B1 * | 9/2001 | Ludikhuize | 257/335 |
| 2004/0027745 A1 | 2/2004 | Kunz et al. | |

* cited by examiner

*Primary Examiner* — Tucker Wright
(74) *Attorney, Agent, or Firm* — Jacqueline J. Garner; Wade J. Brady, III; Frederick J. Telecky, Jr.

(57) ABSTRACT

A bidirectional electrostatic discharge (ESD) protection device includes a substrate having a topside semiconductor surface that includes a first silicon controlled rectifier (SCR) and a second SCR formed therein including a patterned p-buried layer (PBL) including a plurality of PBL regions. The first SCR includes a first and second n-channel remote drain MOS device each having a gate, a source within a p-body, and sharing a first merged drain. The second SCR includes a third and a fourth n-channel remote drain MOS device each having a gate, a source within a p-body, and sharing a second merged drain. The plurality of PBL regions are directly under at least a portion of the sources while being excluded from being directly under either of the merged drains.

16 Claims, 4 Drawing Sheets

BIDIRECTIONAL ELECTROSTATIC DISCHARGE (ESD) PROTECTION

FIELD

Disclosed embodiments relate to semiconductor integrated circuits (ICs), and more specifically to silicon-controlled-rectifier (SCR)-based electrostatic discharge (ESD) protection devices that comprise remote drain MOS devices, such as n-channel drain extended MOS (DENMOS) devices.

BACKGROUND

Modern high-density integrated circuits are known to be vulnerable to damage from the ESD from a charged body (human or otherwise) as the charged body physically contacts an integrated circuit (IC). ESD damage occurs when the amount of charge exceeds the capability of the conduction path through the IC. The typical ESD failure mechanisms include thermal runaway resulting in junction shorting, and dielectric breakdown resulting in gate-junction shorting (e.g., in the metal-oxide-semiconductor (MOS) context).

It is often difficult to analyze the ESD vulnerability of a given IC, because the charge versus time characteristics of ESD events vary quite widely among the various sources of ESD. The ESD protection of modern ICs is characterized according to multiple models, each of which are intended to model a particular type of ESD event. The Human Body Model (HBM) models discharge of a charged human contacting an IC, and is realized by a 150 pF capacitance discharging into the IC within about 100 nsec. The Machine Model (MM) models discharge from metal objects such as IC test and manufacturing equipment, and generally uses a higher capacitance with lower internal resistance than the HBM, resulting in even faster discharge times. The Charged Device Model (CDM) models a discharge from a charged IC to ground, rather than a discharge to the IC. These differences in discharge characteristics and polarity manifest themselves in different failure manifestations within the IC; indeed the conduction may follow different paths within the device.

ESD protection devices generally operate by providing a high capacity current conduction path, so that the brief but massive ESD charge may be safely conducted away from structures that are not capable of handling the ESD event. In some cases, ESD protection is inherent to the particular terminal, as in the case of a power supply terminal which may provide an extremely large area p-n junction capable of conducting the ESD charge. Input and output (functional) terminals, on the other hand, typically have a separate ESD protection device added in parallel to the functional terminal. The ideal ESD protection device turns on quickly in response to an ESD event, with large current conduction capability, but remains off and presents essentially no load or leakage during normal IC operation.

SCR-based ESD protection devices are known. For bidirectional protection, two SCRs are provided in parallel. However, for an SCR, it can be difficult to isolate the current flow paths, particularly during an international electrotechnical commission (IEC) strike. For example, during a negative strike, it can be difficult to prevent current from flowing into the substrate, which can cause current to reach and thus damage nearby devices on the IC.

Moreover, high voltage system-level (IEC) ESD protection requirements place stringent constraints on ESD protection device design. In particular, a suitably high breakdown voltage must be maintained while enabling high current to flow during the strike. Some high voltage MOS devices are particularly ESD sensitive. For example, it has been observed that remote drain MOS devices such as drain extended MOS (DEMOS) devices provide very poor inherent ESD protection.

Remote drain MOS devices include DEMOS devices, and Double-Diffused MOS (DMOS) devices including Lateral Double-Diffused MOS (LDMOS) devices. Such remote drain MOS devices can include a p-type buried layer (PBL) underneath the drain regions to provide higher source-to-drain breakdown voltages while allowing power efficient switch operation due to the known reduced surface field ("resurf") principle.

SUMMARY

Disclosed embodiments recognize conventional bidirectional silicon-controlled rectifier (SCR)-based bidirectional electrostatic discharge (ESD) protection devices built by joining the drain ends of two remote drain MOS (e.g., DEMOS or LDMOS) devices having a p-type buried layer (PBL) under the merged drains to increase the breakdown voltage (such as to >45 V) can be leaky under normal operating (i.e. low voltage/non-ESD) conditions. Such leakage has been recognized by the Inventors herein to result from punch-through between the "+" terminal of the ESD protection device which receives the strike and "−" terminal (which is grounded) via a path from the source to the body of the device acting as the "+" terminal down through the lightly doped deep nwell (DNWell) to the PBL, laterally through the PBL, then up through the DNWell up to the bodies and then the sources of the devices acting as the "−" terminals. It is noted punch-through is not a problem for the unidirectional SCR or its "parent" n-channel DEMOS or n-channel LDMOS because in those applications the "+" terminals are the source of the transistor array, and hence are at the same potential. Therefore this leakage problem is unique to the bidirectional SCRs, such as the bidirectional SCRs disclosed herein.

Disclosed bidirectional SCR-based ESD protection devices therefore do not utilize a PBL underneath the merged drains. Rather than eliminating the PBL to reduce the leakage and as a result forfeit the breakdown voltage improvement, disclosed bidirectional SCR-based ESD protection devices position the PBL under the source terminals which is clearly taught away by the resurf principle which requires the PBL to be under the drains to achieve high breakdown voltage. Such source PBL placement has been unexpectedly found to maintain a high breakdown voltage while reducing or eliminating leakage due to punch-through between the "+" and "−" terminals via the PBL as described above.

Source placement of the PBL for disclosed bidirectional SCR-based ESD protection devices has also been found to unexpectedly provide the ability to control the current flow path and improve the robustness of the bidirectional SCR-based as compared to known bidirectional SCR-based ESD protection circuits having PBL under the joined drains. Disclosed bidirectional SCR-based ESD protection device are also advantageous because implementation can be a layout-only solution, so as to not require changing process parameters that can adversely impact other devices on the IC for disclosed ESD protected IC device embodiments.

BRIEF DESCRIPTION OF THE DRAWINGS

Reference will now be made to the accompanying drawings, which are not necessarily drawn to scale, wherein.

DETAILED DESCRIPTION

Figure 1:
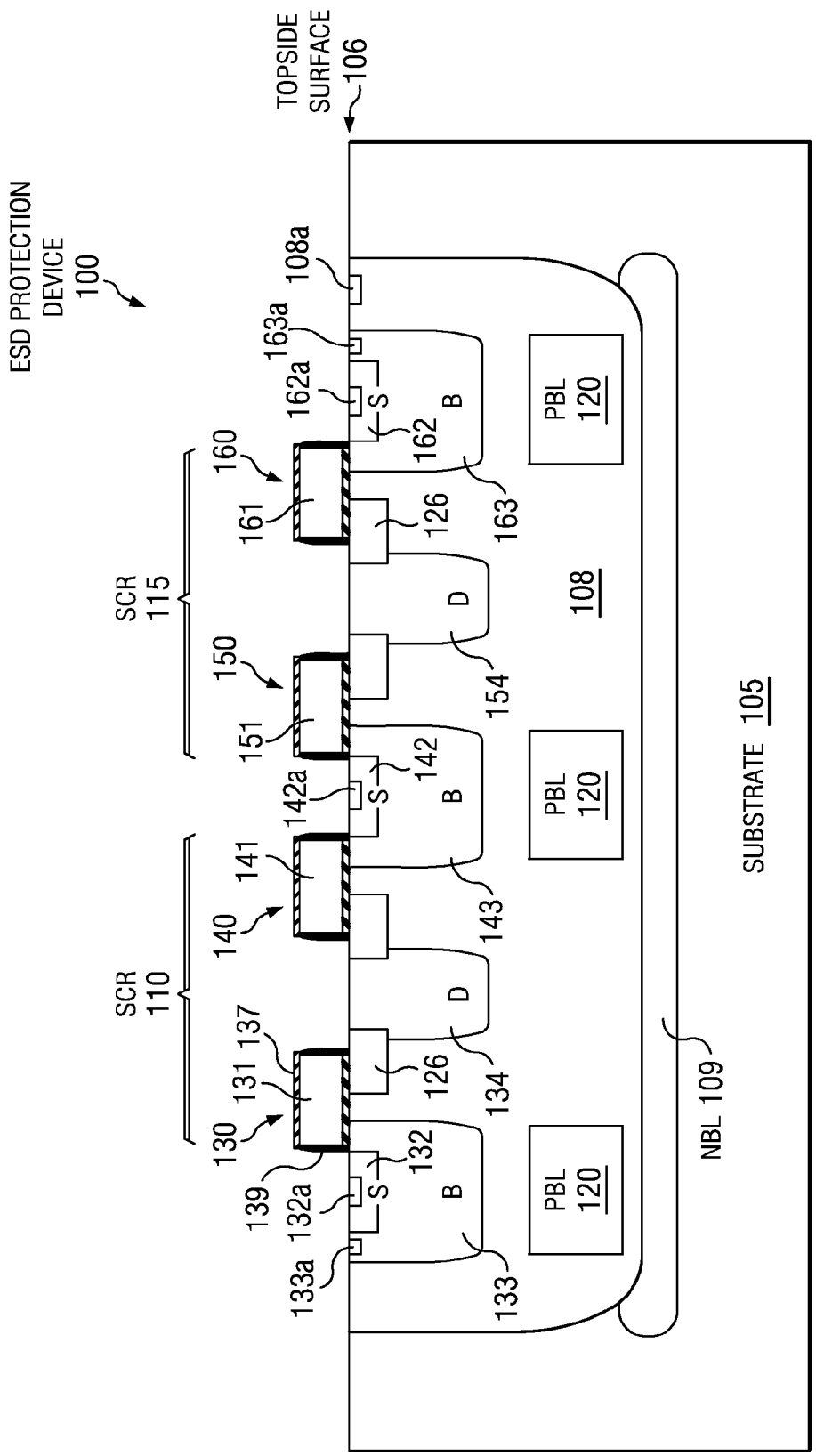
FIG. 1 is a cross sectional depiction of an example bidirectional SCR-based ESD protection device comprising n-channel high voltage MOS devices having merged/common drains shown as drain extended n-channel MOS (DENMOS) devices, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a cross sectional depiction of an example bidirectional SCR-based ESD protection device 100 comprising first and second enhancement mode n-channel remote drain MOS devices having merged/common drains shown as DENMOS devices 130, 140, 150 and 160, according to an example embodiment. It is noted that although the DENMOS devices shown in FIG. 1 and FIG. 2 (described below) are shown as having square or roughly square feature geometries, as known in the art remote drain MOS devices are generally designed having striped (elongated rectangular) or sometimes circular feature geometries, rather than the squares features shown. Disclosed embodiments include remote drain MOS devices having any of these feature shapes.

ESD protection device 100 comprises a substrate 105 having a topside semiconductor surface 106 having a deep nwell (DNWell) 108 and an n-buried layer (NBL) 109 that forms the bottom of the DNWell 108, formed therein. ESD protection device 100 includes a first SCR 110 and a second SCR 115 formed in the DNWell 108 including a patterned PBL buried layer comprising a plurality of PBL regions 120. DNWell 108 includes an n+ contact 108a.

The substrate 105 is generally a silicon or a silicon-germanium substrate, or is more generally a substrate that provides a topside semiconductor surface 106. The topside semiconductor surface 106 is doped p-type, such as a p-epitaxial layer or the surface of a bulk substrate when the substrate 105 comprises a p-substrate.

The first SCR 110 comprises first DENMOS device 130 and second DENMOS device 140 each having a gate 131, 141, a source 132 having a n+ source contact 132a within a p-body 133 having a p+ contact 133a, and source 142 having a n+ source contact 142a within p-body 143, respectively, and sharing a first merged drain 134. The second SCR 115 is shown as third DENMOS device 150 and a fourth DENMOS device 160 each having a gate 151, 161, source 142 within a p-body 143, and source 162 having a n+ source contact 162a within p-body 163 having a p+ contact 163a, respectively, and sharing a second merged drain 154. Spacers 139 are shown in the sidewalls of the gates 131, 141, 151, and 161.

Silicide layer 137 is shown on top of the respective gates 131-161 which is generally provided when the gates 131, 141, 151, 161 comprise polysilicon. Although not shown, silicide layer 137 may also be on the sources, drains and bodies, particularly on their contact areas. Moreover, although not shown, the n+ source contacts are generally coupled to the p+ body contacts (e.g., n+ source contact 132a to p+ body contacts 133a) of their p-body, such as through a resistor or shorted (e.g., by metal). Other than the DENMOS devices shown, the n-channel remote drain MOS devices in disclosed bidirectional SCR-based ESD protection devices can also comprise enhancement mode n-channel Double-Diffused MOS (DMOS) devices including Lateral Double-Diffused MOS (LDMOS) devices.

The PBL regions 120 can be seen to be directly under at least a portion of the sources 132, 142 and 162, while being excluded from being directly under either of the first and second merged drains 134, 154. In the embodiment shown in FIG. 1, the PBL regions 120 are centered directly under the sources 132, 142, 162 and have an area that matches an area of the p-bodies 133, 143, and 163, respectively. As used herein, "matching an area" of the p-bodies 133, 143, and 163 means having dimensions that are ±2 μm relative to the outer edges of the p-bodies 133, 143, and 163. For example, if the p-bodies 133, 143, and 163 are square in shape having a length and width of x μms, PBL regions 120 will have both a length and width of x±2 μm. In another embodiment the PBL regions 120 are sized so that the PBL regions are ±2 μm relative to the active area width, corresponding to roughly the middle of the gates 141 shown in FIG. 1. In another embodiment, the PBL regions 120 are sized to be just wide enough so that the DNWell 108 doping is sufficient to protect from punchthrough, which will depend on the doping in the DNWell 108, lateral profile of the PBL regions, and the voltage rating.

Dielectric isolation features 126 are shown in FIG. 1 extending down from the topside surface 106. For example, dielectric isolation features 126 may include local oxidation of silicon (LOCOS), shallow trench isolation (STI), or other suitable dielectric isolation structures. LOCOS comprises thermal oxide that may be formed using a thermal oxidation under a patterned masking layer. The formation of STI can include etching a trench in the substrate and filling the trench by deposited dielectric materials such as silicon oxide, silicon nitride, or silicon oxynitride. The STI structure may be created using a process sequence comprising growing a pad oxide, forming a low pressure chemical vapor deposition (LPCVD) silicon nitride layer, patterning an STI opening in the nitride layer using photoresist and masking, etching a trench in the substrate, filling the trench with CVD oxide, using chemical mechanical planarization (CMP) to etch back, and then using a nitride strip process to leave the STI structure.

Figure 2:
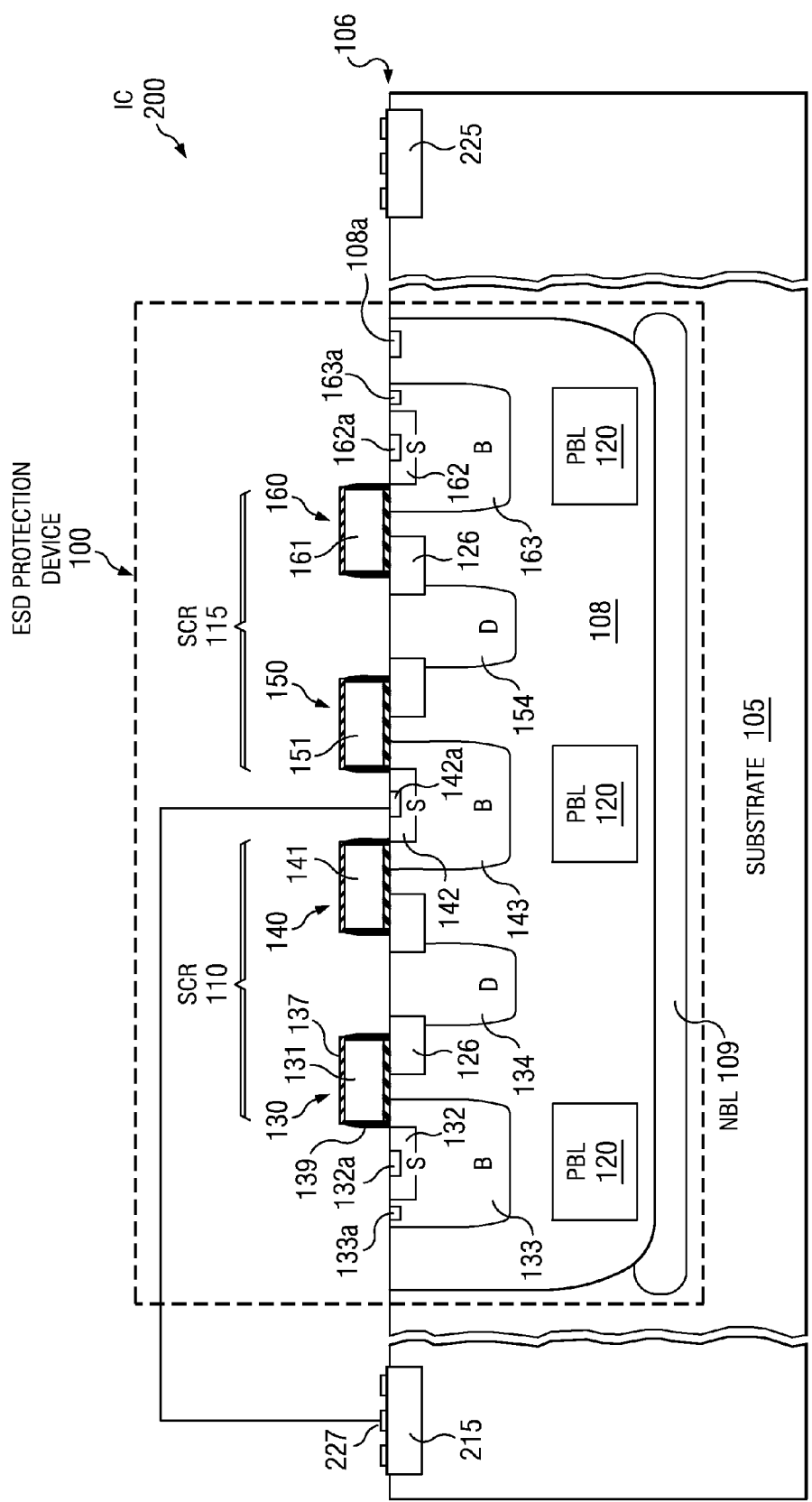
FIG. 2 is a cross sectional depiction of an example ESD protected IC including functional circuitry and a disclosed bidirectional SCR-based ESD protection device that provides ESD protection for at least one pin on the functional circuitry, according to another example embodiment.

FIG. 2 is a cross sectional depiction of an example ESD protected IC 200 including functional circuitry 215 and 225 and a disclosed bidirectional SCR-based ESD protection device 100 that provides ESD protection for at least one pin 227 on the functional circuitry 215, according to another example embodiment. ESD protection device 100 is electrically in parallel to pin 227, with the substrate 105 being the common terminal.

Figure 3:
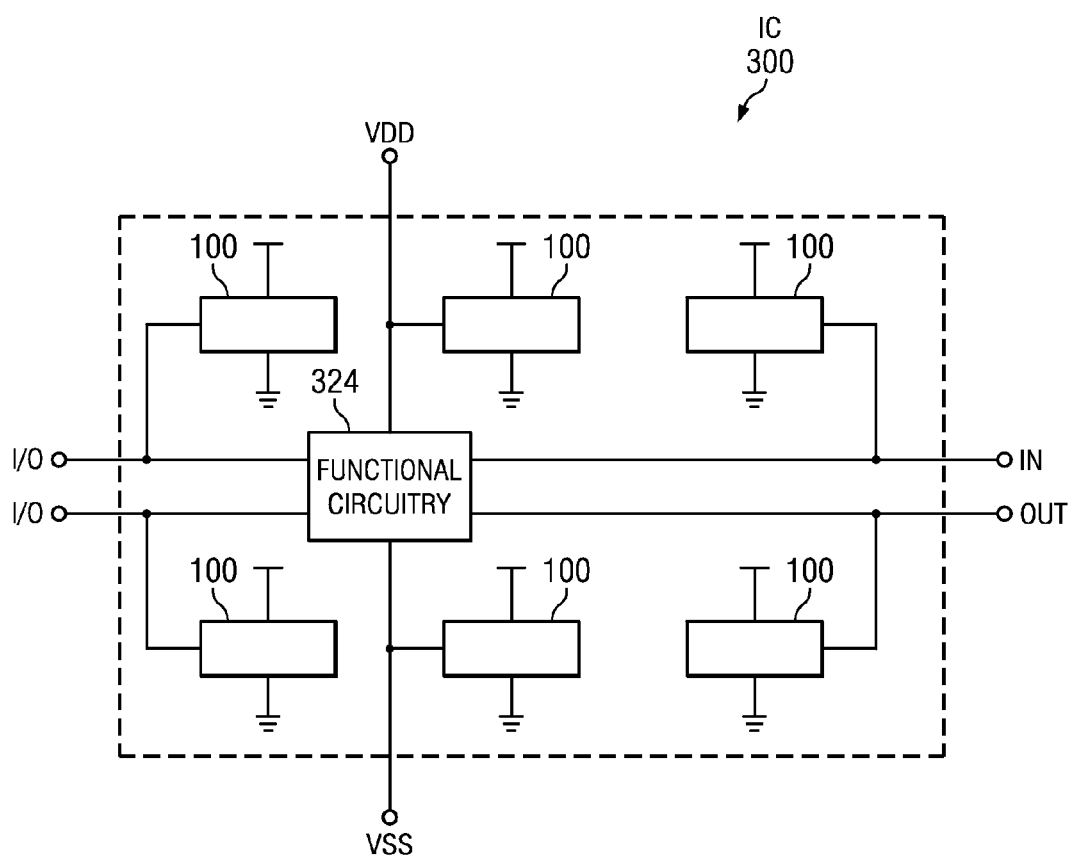
FIG. 3 illustrates a high level depiction of an ESD protected IC into which disclosed bidirectional SCR-based ESD protection devices may be incorporated to protect one or more terminals of the IC, according to an example embodiment.

FIG. 3 illustrates a high level depiction of a construction of an ESD protected IC 300 into which disclosed bidirectional SCR-based ESD protection devices shown as ESD protection device 100 may be incorporated on the IC to protect one or more terminals of the IC, according to an example embodiment. The "T" indicated at the top of the respective ESD protection devices 100 in FIG. 3 represents an input from a suitable trigger circuit, such as being coupled to the otherwise floating common drains 134, 154, or coupled to the bodies 133, 163 of the ESD protection devices 100.

IC 300 includes functional circuitry 324, which is circuitry that realizes and carries out desired functionality of IC 300, such as that of a digital IC (e.g., digital signal processor) or analog IC (e.g., amplifier or power converter). The capability of functional circuitry provided by IC 300 may vary, for example ranging from a simple device to a complex device. The specific functionality contained within functional circuitry 324 is not of importance to disclosed embodiments.

IC 300 also includes a number of external terminals, by way of which functional circuitry 324 carries out its function. A few of those external terminals are illustrated in FIG. 3. It is to be understood that the number of terminals and their function can also vary widely. In the example of IC 300 shown in FIG. 3, two terminals I/O operate as common input and output terminals, by way of which functional circuitry 324 can receive incoming signals and can generate outputs, as well known in the art. A dedicated input terminal IN is also shown in FIG. 3 for IC, as is a dedicated output terminal OUT. Each of terminals IN, OUT are also connected to functional circuitry 324. Power supply terminal Vdd receives a positive power supply voltage in this example, while ground terminal Vss is provided to receive a reference voltage, such as system ground. Although not shown, the ground shown connected to the ESD protection devices 100 is coupled to VSS, such as resistively coupled or shorted together.

IC 300 includes an instance of a disclosed bidirectional SCR-based ESD protection device 100 connected to each of its terminals. Each bidirectional SCR-based ESD protection device 100 is connected to its corresponding terminal in parallel with the functional circuitry 324. Bidirectional SCR-based ESD protection devices 100 are also connected to power supply and reference voltage terminals VDD, VSS, in parallel with functional circuitry 324. However, in some applications, some pins of the device being protected will be self-protecting, such as diode protected power supply pins. Pins also can be protected against different levels of ESD strike (HMB, CDM, IEC, etc.).

Disclosed embodiments can also provide multiple ratings for the bidirectional SCR devices on the same chip. For example, for an ESD protected power amplifier chip that includes 45V/−28V and +65V/−65V DENMOS devices, one bidirectional SCR-based ESD protection device can be used to protect the 45V/−28V devices, and another bidirectional SCR-based ESD protection device can be designed to provide a higher level of protection which can be used to protect +65V/−65V devices. The difference(s) between the design of these bidirectional SCR devices can be in the size of the PBL regions 120, the drift length (length of field oxide region), channel length, polysilicon overhang length for polysilicon gate devices, and other dimensional details. Thus, different disclosed bidirectional SCR devices can be created without adding device elements, but rather by selection of the dimensions of the device' elements to achieve compactness and performance targets (e.g., trigger voltage, holding voltage, thermal failure current, etc).

Figure 4:
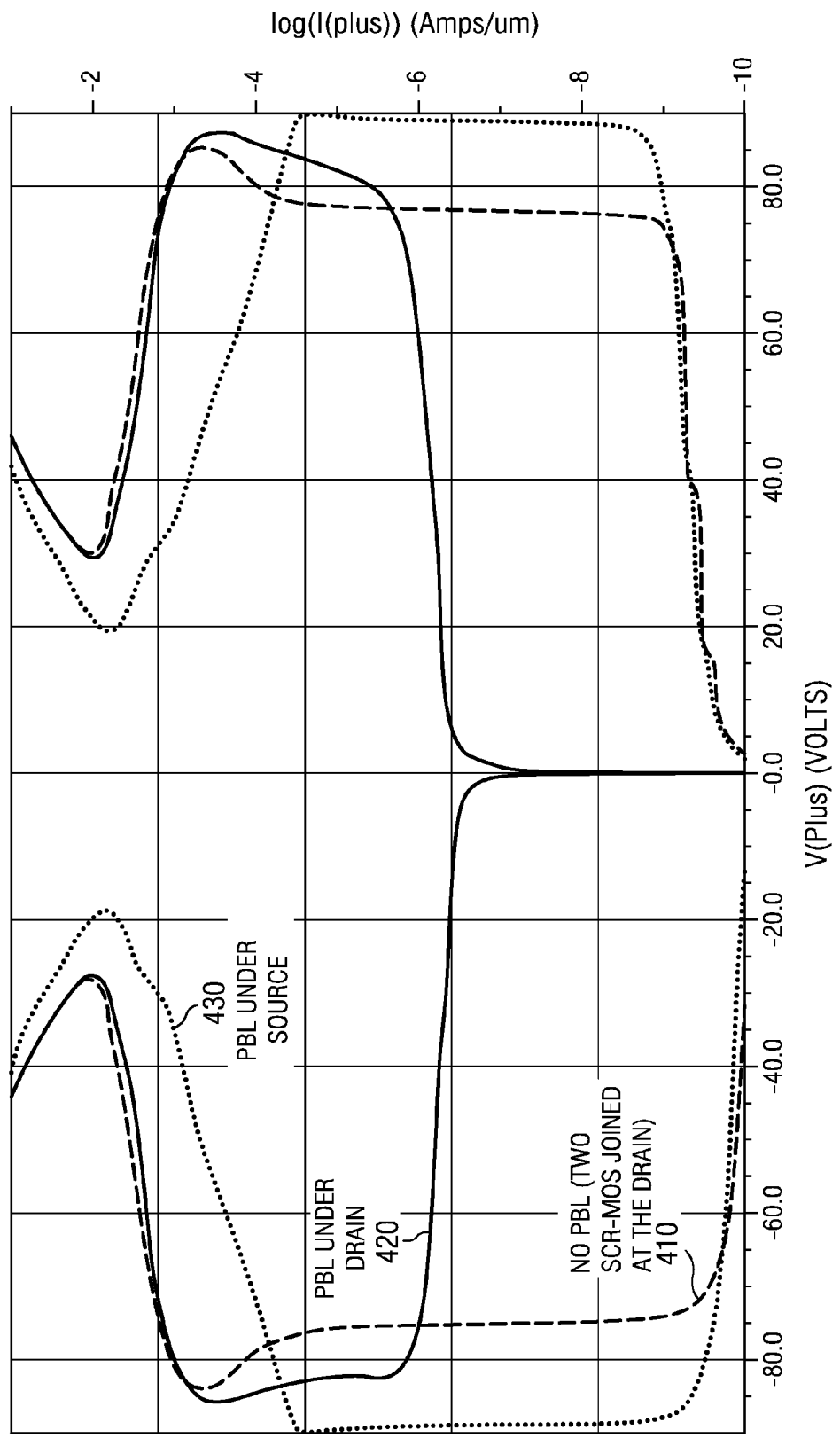
FIG. 4 is comparative log I+ vs. V+ data at 400 K for a known bidirectional SCR-based ESD protection devices having first and second SCRs each comprising DENMOS devices having merged/common drains with no PBL, a known bidirectional SCR-based ESD protection device having first and second SCRs each comprising DENMOS devices having merged/common drains and a PBL under the merged drains, and a disclosed bidirectional SCR-based ESD protection devices having first and second SCRs each comprising DENMOS devices having merged/common drains with a PBL under the sources.

FIG. 4 is comparative log I+ vs. V+ data at 400 K for a known bidirectional SCR-based ESD protection devices having first and second SCRs each comprising DENMOS devices having merged/common drains with no PBL with its I-V curve shown as 410, a known bidirectional SCR-based ESD protection device having first and second SCRs each comprising DENMOS devices having merged/common drains and a PBL under the merged drains with its I-V curve shown as 420, and a disclosed bidirectional SCR-based ESD protection devices having first and second SCRs each comprising DENMOS devices having merged/common drains with a PBL under the sources with its I-V curve shown as 430. The + terminal of each bidirectional SCR-based ESD protection device which receives the strike corresponds to source 142 shown above in FIGS. 1 and 2, while the negative terminals correspond to sources 132 and 162 described above in FIGS. 1 and 2.

The I-V curve shown as 410 (from the known bidirectional SCR-based ESD protection device with no PBL) evidences low leakage ($10^{-9}$ to $10^{-10}$ amps/µm), with a V+ to V− (gnd) breakdown voltage of about 70 V. The I-V curve shown as 420 (from the known bidirectional SCR-based ESD protection device with PBL under the merged drains) evidences punch-through driven leakage (around $10^{-6}$ amps/µm), with a V+ to V− breakdown voltage of about 82 V. The I-V curve shown as 430 (from the disclosed bidirectional SCR-based ESD protection device with PBL under the sources) evidences low leakage ($10^{-9}$ to $10^{-10}$ amps/µm), with a V+ to V− breakdown voltage of nearly 90 V. Disclosed bidirectional SCR-based ESD protection devices are thus shown in FIG. 4 to provide the low leakage provided by the known bidirectional SCR-based ESD protection device without a PBL, with a V+ to V− breakdown voltage higher than the V+ to V− breakdown voltage provided by the known bidirectional SCR-based ESD protection device with the PBL under the merged drains that benefits from the resurf principle.

Advantages of disclosed bidirectional SCR-based ESD protection devices include a high breakdown voltage while reducing or eliminating leakage due to punch-through between the "+" and "−" terminals via the PBL as described above. Disclosed bidirectional SCR-based ESD protection devices have also been found to provide the ability to control the current flow path and improve the robustness of the bidirectional SCR-based as compared to known bidirectional SCR-based ESD protection circuits having PBL under the merged drains. Moreover, disclosed bidirectional SCR-based ESD protection device are also advantageous because implementation can be a layout-only solution, so as to not require changing process parameters that can adversely impact other devices.

Disclosed embodiments can be integrated into a variety of assembly flows to form a variety of different semiconductor integrated circuit (IC) devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A bidirectional electrostatic discharge (ESD) protection device, comprising:

a substrate having a topside semiconductor surface that includes a first silicon controlled rectifier (SCR) and a second SCR formed therein including a patterned p-buried layer (PBL) comprising a plurality of PBL regions;

said first SCR comprising a first and second n-channel remote drain MOS devices each having a gate, a source within a p-body, and sharing a first merged drain, and said second SCR comprising a third and a fourth n-channel remote drain MOS device each having a gate, a source within a p-body, and sharing a second merged drain;

wherein said plurality of PBL regions are directly under at least a portion of said sources while being excluded from being directly under said first and said second merged drains.

2. The bidirectional ESD protection device of claim 1, wherein said first, second, third and fourth n-channel remote drain MOS devices each comprise n-channel drain extended MOS (DENMOS) devices.

3. The bidirectional ESD protection device of claim 1, wherein said topside semiconductor surface is a silicon surface.

4. The bidirectional ESD protection device of claim 1, wherein said plurality of PBL regions match an area of their respective ones of said p-bodies.

5. The bidirectional ESD protection device of claim 1, wherein said plurality of PBL regions are completely within an area of their respective ones of said p-bodies.

6. The bidirectional ESD protection device of claim 1, further comprising a plurality of dielectric isolation features in said topside semiconductor surface.

7. The bidirectional ESD protection device of claim 6, wherein said plurality of dielectric isolation features comprise Shallow Trench Isolation (STI) features.

8. The bidirectional ESD protection device of claim 6, wherein said plurality of dielectric isolation features comprise Local Oxidation of Silicon (LOCOS) features.

9. A bidirectional electrostatic discharge (ESD) protection device, comprising:
a substrate having a topside silicon surface that includes a first silicon controlled rectifier (SCR) and a second SCR formed therein including a patterned p-buried layer (PBL) comprising a plurality of PBL regions;

said first SCR comprising a first and second n-channel drain extended MOS (DENMOS) device each having a gate, a source within a p-body, and sharing a first merged drain, and said second SCR comprising a third and a fourth DENMOS device each having a gate, a source within a p-body, and sharing a second merged drain;

wherein said plurality of PBL regions are directly under at least a portion of said sources while being excluded from being directly under said first and said second merged drains, and wherein said plurality of PBL regions match an area of their respective ones of said p-bodies.

10. An integrated circuit (IC), comprising:
a substrate having a topside semiconductor surface;

functional circuitry formed using said topside semiconductor surface configured to realize and carry out a functionality having a plurality of terminals including at least a first terminal and a ground terminal;

at least one bidirectional electrostatic discharge (ESD) protection device using from said topside semiconductor surface, comprising:
a first silicon controlled rectifier (SCR) and a second SCR formed therein including a patterned p-buried layer (PBL) comprising a plurality of PBL regions;

said first SCR comprising a first and second n-channel remote drain extended MOS device each having a gate, a source within a p-body, and sharing a first merged drain, and said second SCR comprising a third and a fourth n-channel remote drain MOS device each having a gate, a source within a p-body and sharing a second merged drain;

wherein said plurality of PBL regions are directly under at least a portion of said sources while being excluded from being directly under said first and said second merged drains, and wherein said bidirectional electrostatic discharge (ESD) protection device is connected to at least said first terminal.

11. The IC of claim 10, wherein said first, second, third and fourth n-channel remote drain MOS devices each comprise n-channel drain extended MOS (DENMOS) devices.

12. The IC of claim 10, wherein said plurality of PBL regions match an area of their respective ones of said p-bodies.

13. The IC of claim 10, wherein said plurality of PBL regions are completely within an area of their respective ones of said p-bodies.

14. The IC of claim 10, further comprising a plurality of dielectric isolation features in said topside semiconductor surface.

15. The IC of claim 14, wherein said plurality of dielectric isolation features comprise Shallow Trench Isolation (STI) features.

16. The IC of claim 14, wherein said plurality of dielectric isolation features comprise Local Oxidation of Silicon (LOCOS) features.

* * * * *